(12) United States Patent
Ha et al.

(10) Patent No.: US 8,054,123 B2
(45) Date of Patent: Nov. 8, 2011

(54) FAST DIFFERENTIAL LEVEL SHIFTER AND BOOT STRAP DRIVER INCLUDING THE SAME

(75) Inventors: Chang-Woo Ha, Seongnam-si (KR); Seung-Hun Hong, Namyangju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/646,616

(22) Filed: Dec. 23, 2009

(65) Prior Publication Data

US 2010/0164593 A1 Jul. 1, 2010

(30) Foreign Application Priority Data

Dec. 30, 2008 (KR) .................. 10-2008-0136655

(51) Int. Cl.
*H03L 5/00* (2006.01)
(52) U.S. Cl. .................. 327/333; 326/62; 326/81
(58) Field of Classification Search .......... 327/172–175, 327/306, 333; 326/62–63, 80–82
See application file for complete search history.

(56) References Cited

U.S. PATENT DOCUMENTS

| | | | | |
|---|---|---|---|---|
| 5,559,464 A | * | 9/1996 | Orii et al. | 327/333 |
| 6,429,700 B1 | * | 8/2002 | Yang | 327/108 |
| 7,501,876 B2 | * | 3/2009 | Kimura | 327/333 |
| 7,710,093 B2 | * | 5/2010 | Dwarakanath et al. | 323/282 |
| 2008/0238525 A1 | * | 10/2008 | Flaibani et al. | 327/333 |

* cited by examiner

*Primary Examiner* — Dinh T. Le
(74) *Attorney, Agent, or Firm* — Sherr & Vaughn, PLLC

(57) ABSTRACT

A boot strap driver including a fast differential level shifter are disclosed. The fast differential level shifter may include a first differential amplifier differentially amplifying a pulse width modulation signal and an inverted pulse width modulation signal and outputting a first differential amplification voltage and a second differential amplification voltage based on the amplified result. The fast differential level shifter may also include a second differential amplifier differentially amplifying the first differential amplification voltage and the second differential amplification voltage, and shifting the differential amplification voltages to voltages having an output range between a first voltage and a second voltage based on the amplified result.

13 Claims, 4 Drawing Sheets

FAST DIFFERENTIAL LEVEL SHIFTER AND BOOT STRAP DRIVER INCLUDING THE SAME

The present application claims priority under 35 U.S.C. 119 to Korean Patent Application No. 10-2008-0136655 (filed on Dec. 30, 2008), which is hereby incorporated by reference in its entirety.

BACKGROUND

A boot strap driver is one of the techniques used when a gate signal voltage of an upper switch is greater than an input power voltage in an output buffer having a push-pull type inverter structure including the upper switch and a lower switch. Since the boot strap driver uses a voltage higher than the input power voltage, a level shift circuit that boosts the input power voltage to a boot strap power voltage is required.

Figure 1:
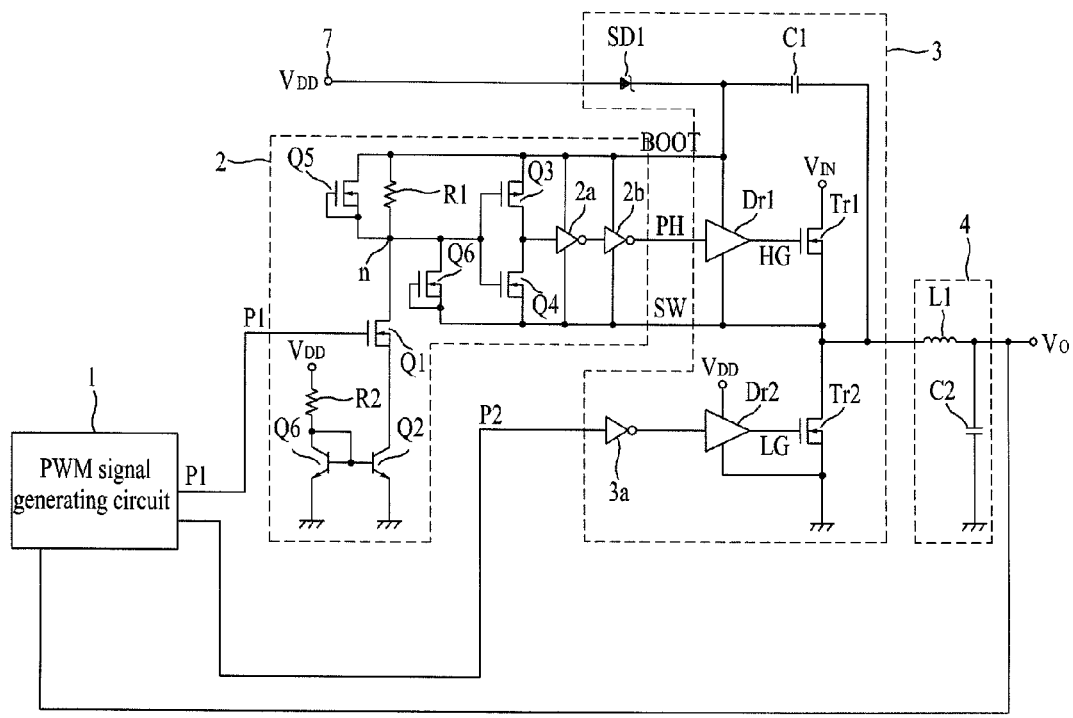

FIG. 1 is a schematic diagram illustrating a related boot strap driver 100. Referring to FIG. 1, the boot strap driver 100 includes a pulse width modulation (PWM) signal generating circuit 1, a level shift circuit 2, a boot strap switching circuit 3, and a smoothing circuit 4.

The boot strap driver 100 has a single input structure where a single transistor, i.e., first transistor Q1 is used. Accordingly, switching of the boot strap driver 100 depends on a threshold voltage of the first transistor Q1, whereby switching speed is slow.

Also, in the boot strap driver 100, a third transistor Q3 and a fourth transistor Q4 are operated by a drain current of a second transistor Q2 and a voltage applied to a first resistor R1. Accordingly, characteristics of the first resistor R1 and a fifth transistor Q5 are varied by a temperature of a chip and frequency variation of an input voltage VDD. For this reason, an operational error of the third transistor Q3 and the fourth transistor Q4 occurs, and a defect ratio may increase during mass production of the chip.

Although a level shift circuit can be implemented in various ways, in the case of the boot strap driver, since a boot strap power source BOOT and SW is varied depending on a voltage that switches the third transistor Q3 and the fourth transistor Q4, a specific structure is required in view of inner pressure and efficiency.

SUMMARY

Embodiments relate to semiconductor devices, and more particularly, to a fast differential level shifter and a boot strap driver including the same. Embodiments relate to a fast differential level shifter and a boot strap driver including the same, in which the level shifter stably controls an input output voltage, has high gain, and implements a broad bandwidth to prevent distortion of a PWM signal from occurring.

Embodiments relate to a fast differential level shifter which may include a first differential amplifier differentially amplifying a pulse width modulation signal and an inverted pulse width modulation signal and outputting a first differential amplification voltage and a second differential amplification voltage based on the amplified result. The fast differential level shifter may also include a second differential amplifier differentially amplifying the first differential amplification voltage and the second differential amplification voltage, and shifting the differential amplification voltages to voltages having an output range between a first voltage and a second voltage based on the amplified result.

Embodiments also relate to a boot strap driver which may include a PWM signal generator generating a PWM signal; a level shifter shifting the PWM signal to a boot strap output voltage having a voltage range from a first boot strap voltage to a second boot strap voltage by differentially amplifying the PWM signal in two stages; and an upper driver biased by the first and second boot strap voltages, driving the output of the level shifter and outputting a first driven signal, wherein the level shifter differentially amplifies the PWM signal and an inverted PWM signal, outputs a first differential amplification voltage and a second differential amplification voltage based on the amplified result, differentially amplifies the first differential amplification voltage and the second differential amplification voltage, and outputting the boot strap output voltage based on the amplified result.

According to embodiments, as the level shifter and the boot strap driver including the same are implemented in a two-stage different amplification structure, they can stably control the input output voltage, have high gain, and implement a broad bandwidth to enable normal operation without distortion even at a high frequency of 1 Mhz or greater. Also, as a clamping circuit is provided, it is advantageous in that an inner circuit can be protected.

DRAWINGS

FIG. 1 is a schematic diagram illustrating a related boot strap driver.

Figure 2:
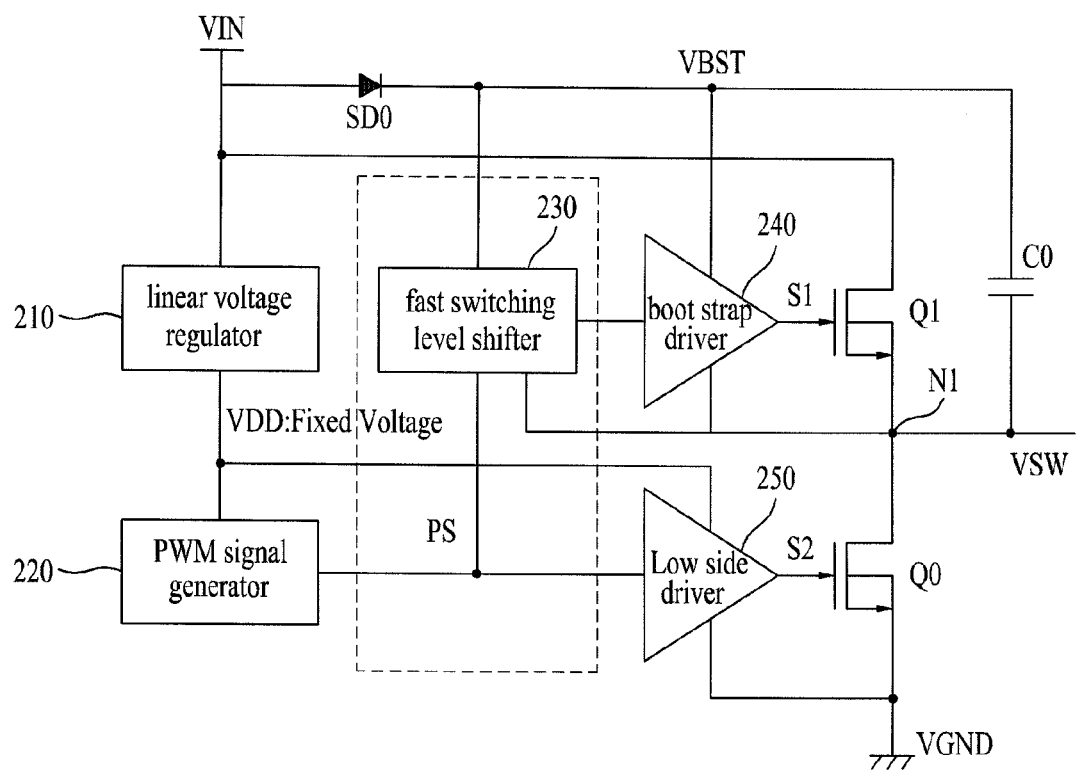

Example FIG. 2 is a block diagram illustrating a boot strap driver according to embodiments.

Figure 3:
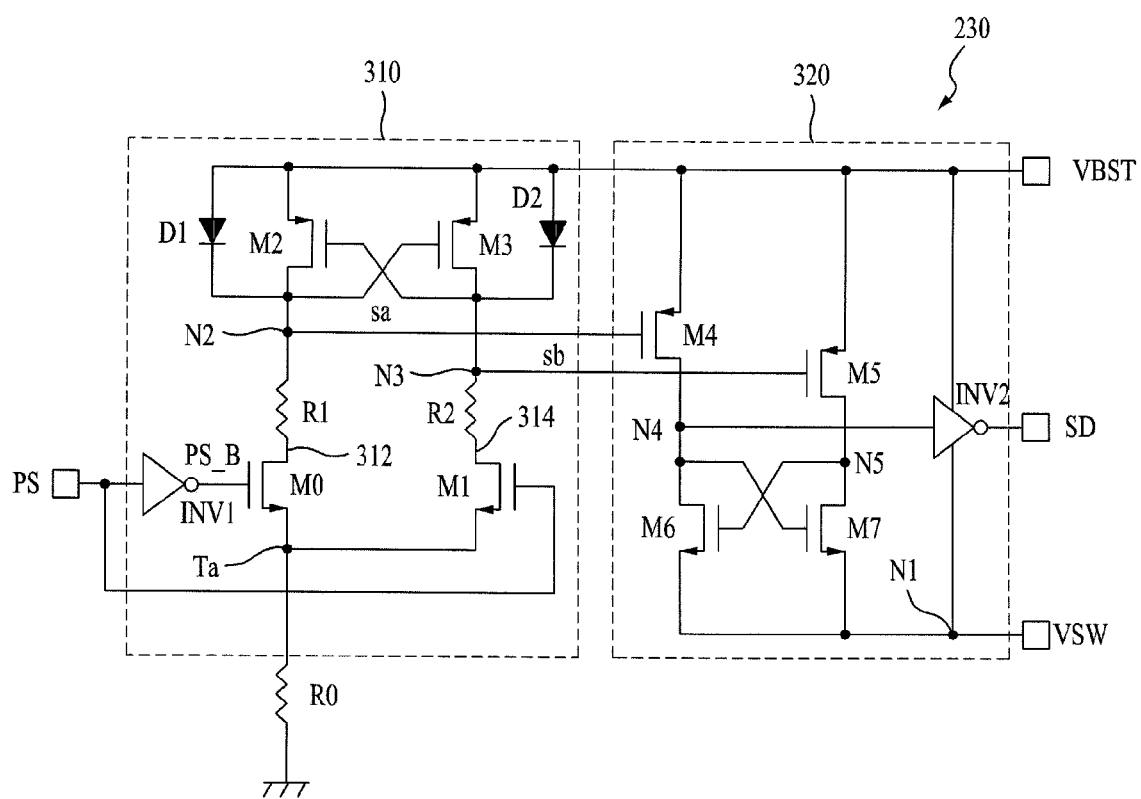

Example FIG. 3 is a circuit diagram illustrating a fast switching level shifter according to embodiments, as shown in example FIG. 2.

Figure 4:
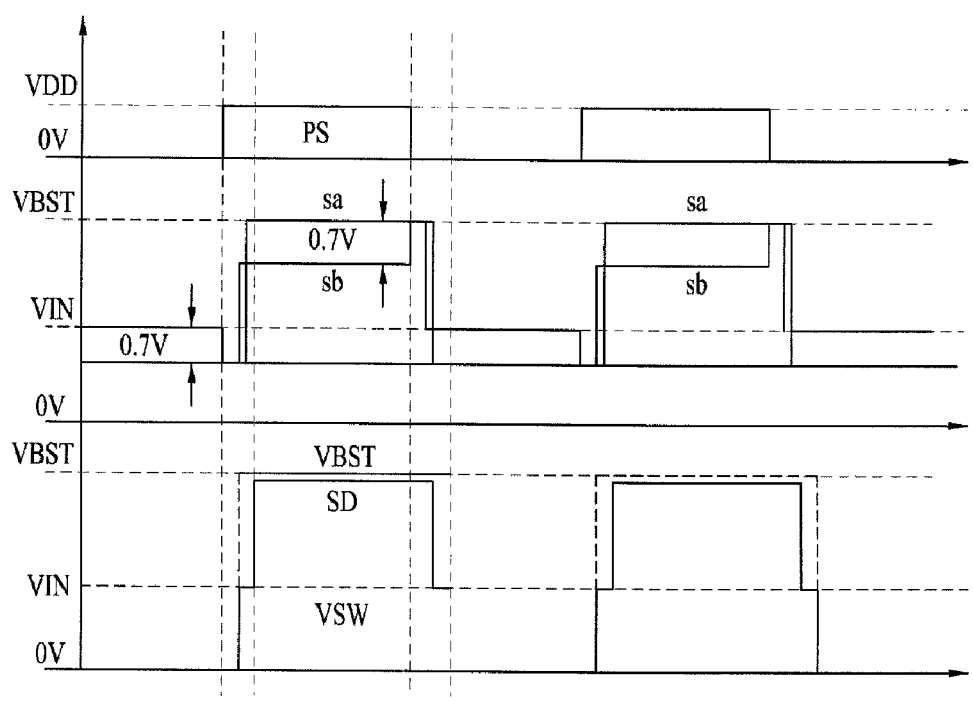

Example FIG. 4 is a diagram illustrating output waveforms of a first amplifier and a second amplifier of the fast switching level shifter shown in example FIG. 3.

DESCRIPTION

Example FIG. 2 is a block diagram illustrating a boot strap driver 200 according to embodiments. Referring to example FIG. 2, the boot strap driver 200 may include a linear voltage regulator 210, a PWM signal generator 220, a fast differential level shifter 230, an upper driver 240, a low side driver 250, an upper switch Q1, a lower switch Q2, a capacitor C0, and a boot strap diode SD0.

The linear voltage regulator 210 shifts a voltage of a first power source VIN to provide a fixed inner voltage VDD. The PWM signal generator 220 outputs an independent PWM signal PS to the first power source VIN based on the inner voltage VDD. The fast switching level shifter 230 shifts the PWM signal PS having a lower voltage range to a voltage having a voltage range VSW~VBST, in other words, between a first boot strap voltage VBST and a second boot strap voltage VSW.

At this time, the transformation speed of the fast switching level shifter 230 determines a speed of the boot strap driver 200 and frequency of the PWM signal PS. The boot strap diode SD0 may be connected between the first power source VIN and the fast switching level shifter 230, and the capacitor C0 is connected between the boot strap diode SD0 and an output node N1.

The upper driver 240 may be biased by a voltage (hereinafter, referred to as "first boot strap voltage VBST") applied to an output node (hereinafter, referred to as "boot strap node") of the boot strap diode D0 and a voltage (hereinafter, referred to as "second boot strap voltage VSW") applied to the output node N1, and drives the output of the fast switching level shifter 230 and outputs a first driven signal S1. The low side driver 250 may be biased by the inner voltage VDD and a second power voltage (for example, ground voltage VGND), and drives the PWM signal PS and outputs a second driven signal S2.

The upper switch Q1 may be connected between the first power source VIN and the output node N1, and may be turned on or turned off in response to the first driven signal S1. The lower switch Q2 may be connected between the second power source VGND and the output node N1, and may be turned on or turned off in response to the second driven signal S2.

Example FIG. 3 is a circuit diagram illustrating a fast switching level shifter 230 according to embodiments, as shown in example FIG. 2. Referring to example FIG. 2 and example FIG. 3, the fast switching level shifter 230 may include a first differential amplifier 310 and a second differential amplifier 320. The first differential amplifier 310 differentially amplifies the PWM signal PS and an inversed PWM signal PS_B and outputs a first differential amplification voltage Sa and a second differential amplification voltage Sb.

The first differential amplifier 310 may include an inverter INV1, a pair of first differential transistors M0 and M1, a bias resistor R0, a first inner pressure protective resistor R1, a second inner pressure protective resistor R2, a first load transistor M2, a second load transistor M3, a first clamping diode D1, and a second clamping diode D2. The inverter INV1 inverts the PWM signal PS, and outputs the inverted PWM signal PS_B.

The pair of first differential transistors M0 and M1 may use the PWM signal PS as a first input and may use the output of the inverter INV1, i.e., the inverted PWM signal PS_B as a second input. For example, the PWM signal PS may be input to a gate of the first differential transistor M1, and the inverted PWM signal PS_B may be input to a gate of the first differential transistor M0.

The bias resistor R0 may be connected between a tail Ta of the pair of first differential transistors M0 and M1 and the second power source (for example, ground power source). In this case, the tail Ta means a connection node of each source terminal of the pair of first differential transistors M0 and M1.

The first inner pressure protective resistor R1 may be connected between a first output terminal 312 of the pair of first differential transistors M0 and M1 and a second node N2. The second inner pressure protective resistor R2 may be connected between a second output terminal 314 of the pair of first differential transistors M0 and M1 and a third node N3. For example, the first inner pressure protective resistor R1 may be connected between a drain 312 of the first differential transistor M0 and the second node N2, and the second inner pressure protective resistor R2 may be connected between a drain 314 of the first differential transistor M1 and the third node N3.

The first load transistor M2 may be connected between the second node N2 and the boot strap node, and may include a gate connected to the third node N3. The second load transistor M3 may be connected between the third node N3 and the boot strap node, and may include a gate connected to the second node N2.

The first clamping diode D1 may be connected between the boot strap node and the second node N2 in a forward direction from the boot strap node to the second node N2. The second clamping diode D2 may be connected between the boot strap node and the third node N3 in a forward direction from the boot strap node to the third node N3.

The voltage applied to the second node N2 will be referred to as a first differential amplification voltage Sa, and the voltage applied to the third node N3 will be referred to as a second differential amplification voltage Sb.

The first differential amplification voltage Sa and the second differential amplification voltage Sb may be clamped from the boot strap voltage VBST to a certain voltage by the clamping operation of the first clamping diode D1 and the second clamping diode D2.

A gate oxide of a pair of second differential transistors M4 and M5 which will be described later can be protected by the clamping operation of the first clamping diode D1 and the second clamping diode D2. Also, the first and second inner pressure protective resistors R1 and R2 protect a gate oxide of the first and second load transistors from a current peak occurring during initial condition or switching of the circuit. Unlike example FIG. 3, the first and second inner pressure protective resistors R1 and R2 or the first and second clamping diodes D1 and D2 may be omitted.

The second differential amplifier 320 differentially amplifies the first differential amplification voltage Sa and the second differential amplification voltage Sb and outputs the amplified result. The second differential amplifier 320 includes a pair of second differential transistors M4 and M5, a third load transistor M6, a fourth load transistor M7, and a second inverter INV2.

The pair of second differential transistors M4 and M5 use the first differential amplification voltage Sa as a first input and use the second differential amplification voltage Sb as a second input. A tail of the pair of second differential transistors M4 and M5 may be connected to the boot strap node, and each of output terminals of the pair of second differential transistors M4 and M5 may be connected to corresponding one of a fourth node N4 and a fifth node N5.

For example, the second differential transistor M4 may be connected between the boot strap node and the fourth node N4, and includes a gate connected to the second node N2. The second differential transistor M5 may be connected between the boot strap node and the fifth node N5, and may include a gate connected to the third node N3.

The third differential transistor M6 may be connected between the fourth node N4 and the output node N1, and may include a gate connected to the fifth node N5. The fourth differential transistor M7 may be connected between the fifth node N5 and the output node N1, and includes a gate connected to the fourth node N4. The second inverter INV2 is biased by the first boot strap voltage VBST and the second boot strap voltage VSW, inverts the voltage of the fourth node N4, and outputs the inverted voltage SD.

Example FIG. 4 is a diagram illustrating output waveforms of a first amplifier 310 and a second amplifier 320 of the fast switching level shifter 230 shown in example FIG. 3. Referring to example FIG. 4, the pair of second differential transistors M4 and M5 shift the differential amplification voltages Sa and Sb output from the first differential amplifier 310 to a voltage having an output range between the first boot strap voltage VBST and the second bootstrap voltage VSW. A single final PWM signal SD is output by the second inverter INV2 in a single ended mode.

Since the related level shifter shown in FIG. 1 uses a common source type single transistor Q1, the range of the output voltage is limited. Although gain is great, a bandwidth is small, whereby distortion occurs at a frequency having high edge of the PWM signal. For this reason, the related level shifter is available only at a low frequency of 300 KHz or less.

However, since the level shifter according to embodiments as shown in example FIG. 3 may be implemented in a two-stage differential amplification structure, it has the same gain as that of the related shifter shown in FIG. 1 or higher gain, and implements a broad bandwidth to enable normal operation without distortion even at a high frequency of 1 Mhz or greater.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a first differential amplifier differentially amplifying a pulse width modulation signal and an inverted pulse width modulation signal and outputting a first differential amplification voltage and a second differential amplification voltage based on the amplified result; and
a second differential amplifier differentially amplifying the first differential amplification voltage and the second differential amplification voltage, and shifting the differential amplification voltages to voltages having an output range between a first voltage and a second voltage based on the amplified result,
wherein the first differential amplifier includes:
a pair of first differential transistors to which the pulse width modulation signal and the inverted pulse width modulation signal are differentially input;
a bias resistor connected between a tail of the pair of first differential transistors and a ground power source;
a first inner pressure protective resistor connected between a first output terminal of the pair of first differential transistors and a first node;
a second inner pressure protective resistor connected between a second output terminal of the pair of first differential transistors and a second node;
a first load transistor connected between the first node and the first boot strap power source, including a gate connected to the second node; and
a second load transistor connected between the second node and the first boot strap power source, including a gate connected to the first node.

2. The apparatus of claim 1, wherein the first differential amplifier includes:
a pair of first differential transistors to which the pulse width modulation signal and the inverted pulse width modulation signal are differentially input.

3. The apparatus of claim 2, wherein the first differential amplifier includes a load part connected between a first power source and output terminals of the pair of first differential transistors, clamping the output voltage of the first differential transistors.

4. The apparatus of claim 1, wherein the first differential amplifier includes a first load transistor connected between a first output terminal of output terminals of the pair of differential transistors and a first boot strap power source, including a gate connected to a second output terminal of the output terminals of the pair of differential transistors.

5. The apparatus of claim 4, wherein the first differential amplifier includes a second load transistor connected between the first boot strap power source and the second output terminal, including a gate connected to the first output terminal.

6. The apparatus of claim 1, wherein the first differential amplifier includes a first clamping diode connected between the first power source and the first node in a forward direction from the first boot strap power source to the first node.

7. The apparatus of claim 6, wherein the first differential amplifier includes a second clamping diode connected between the first power source and the second node in a forward direction from the first power source to the second node.

8. The apparatus of claim 1, wherein the second differential amplifier includes a pair of second differential transistors to which the first differential amplification voltage and the second differential amplification voltage are differentially input, having a tail connected to the first boot strap power source.

9. The apparatus of claim 8, wherein the second differential amplifier includes a third load transistor connected between a first output terminal of output terminals of the pair of second differential transistors and a second boot strap power source, including a gate connected to a second output terminal of the output terminals of the pair of second differential transistors.

10. The apparatus of claim 9, wherein the second differential amplifier includes a fourth load transistor connected between the second output terminal and the second boot strap power source, including a gate connected to the first output terminal.

11. The apparatus of claim 8, wherein one of the pair of second differential transistors includes a gate connected to the first node, and the other one of the pair of second differential transistors includes a gate connected to the second node.

12. The apparatus of claim 10, including a second inverter connected to any one of the first output terminal and the second output terminal and biased by the first boot strap power source and the second boot strap power source.

13. The apparatus of claim 1, wherein the pair of first differential transistors and the pair of second differential transistors are NMOS transistors, and the first load transistor and the second load transistor are PMOS transistors.

* * * * *